United States Patent [19]
Gmitter et al.

[11] Patent Number: 5,201,996
[45] Date of Patent: Apr. 13, 1993

[54] PATTERNING METHOD FOR EPITAXIAL LIFT-OFF PROCESSING

[75] Inventors: Thomas J. Gmitter, Lakewood; Eli Yablonovitch, Leonardo, both of N.J.

[73] Assignee: Bell Communications Research, Inc., Livingston, N.J.

[21] Appl. No.: 516,173

[22] Filed: Apr. 30, 1990

[51] Int. Cl.$^5$ ............................................. H01L 21/00
[52] U.S. Cl. .................... 156/655; 156/658; 156/659.1; 156/662; 437/228
[58] Field of Search ............ 156/662, 659.1, 645, 156/658, 632, 655; 437/228

[56] References Cited

U.S. PATENT DOCUMENTS

| | | | |
|---|---|---|---|
| 3,290,192 | 12/1966 | Kelley | 156/659.1 X |
| 4,035,226 | 7/1977 | Farber et al. | 156/659.1 X |
| 4,325,779 | 4/1982 | Rossetti | 156/651 |
| 4,818,336 | 4/1989 | Rossetti | 156/658 X |
| 4,846,931 | 7/1989 | Gmitter et al. | 156/633 |
| 4,883,561 | 11/1989 | Gmitter et al. | 156/633 |

OTHER PUBLICATIONS

E. Yablonovitch et al., Extreme Selectivity in the Lift-off of Epitaxial GaAs Films, Appl. Phys. Lett. 51 (1987), pp. 2222-2224.
E. Yablonovitch et al., Regrowth of GaAs Quantum Wells on GaAs Liftoff Films..., Electronics Letters 25 (1989), p. 171.
E. Yablonovitch et al., Double Heterostructure GaAs-/AlGaAs Thin Film Diode..., IEEE Photonics Tech. Lett. 1 (1989), pp. 41-42.

*Primary Examiner*—David A. Simmons
*Assistant Examiner*—Thi Dang
*Attorney, Agent, or Firm*—James W. Falk; Charles S. Guenzer

[57] ABSTRACT

In the fabrication of microelectronic, optoelectronic, and photonic devices, methods are being used which involve selective processing of material in the presence of a patterned mask layer; for example, such processing may involve etching. Typically, mask layer material is chosen on the basis of response to suitable radiation, allowing for patterning by selective irradiation followed by selective removal of mask layer material. However, in so-called epitaxial lift-off processing, material to be processed may be covered with a support layer of a material which is selected in view of desired mechanical and thermal properties, and which is not amenable to patterning by radiation. A method is described which provides for patterning of such layer by heated mechanical means such as a heated stylus or roller.

15 Claims, 3 Drawing Sheets

5,201,996

PATTERNING METHOD FOR EPITAXIAL LIFT-OFF PROCESSING

This invention was made partially with Government support under Contract DAAL01-89-C-0900 awarded by the Department of the Army. The Government has certain rights in this invention.

TECHNICAL FIELD

The invention is concerned with pattern formation in the fabrication of microelectronic, optoelectronic, and photonic devices.

BACKGROUND OF THE INVENTION

The fabrication of microelectronic, optoelectronic, and photonic devices typically involves numerous steps, including layer formation, dopant implantation, and selective pattern processing-- resulting in a desired structure to be electrically contacted and/or optically accessed. In this context, special attention will be paid in the following to pattern processing as applicable, e.g., in pattern etching, and especially to the patterning of a mask layer prior to processing of underlying material.

On a material to be processed, e.g., by etching, a mask or "resist" layer may be formed of a material which is sensitive to suitable radiation such as, e.g., visible or ultraviolet light, electrons, x-rays, or ions. After such a material has been selectively exposed to radiation, exposed or unexposed areas may be selectively removed by a chemical agent which leaves complementary areas essentially unaffected.

In the practice of such methods, the choice of mask material is preferably based on radiation response. However, there are instances in which material to be processed is coated with an auxiliary layer whose material composition is selected on the basis of different criteria: for example, in so-called epitaxial lift-off processing of an epitaxially grown layer, a support layer material may be chosen mainly on account of desirable properties including a low Young's modulus, a high coefficient of expansion, high adhesion, and high chemical durability.

Epitaxial lift-off processing involves growth of a desired film on a first, auxiliary or growth substrate, followed by removal of such film onto a second, desired device substrate. Such processing is receiving attention, e.g., as an alternative to lattice-mismatched epitaxial growth, the combination of silicon and Group III–V technologies currently being of particular interest. For example, as disclosed by E. Yablonovitch et al., "Extreme Selectivity in the Lift-off of Epitaxial GaAs Films", Applied Physics Letters 51 (1987), pp. 2222–2224, a gallium arsenide layer can be grown on an intermediary aluminum arsenide layer on a gallium arsenide substrate, and the grown gallium arsenide layer can be lifted off upon undercut etching—i.e., upon chemical dissolution of the intermediary layer.

Epitaxial lift-off is facilitated by use of a support layer which is formed on the layer to be lifted off, and it was found that a material known as Apiezon-W is particularly suited for this purpose. Indeed, use of such material results in preferred edge-curling during undercut-etching; see U.S. Pat. Nos. 4,846,931 and 4,883,561, issued to T. J. Gmitter et al. on Jul. 11, 1989 and Nov. 28, 1989, respectively. For exemplary uses of resulting films as bonded to desired substrates see, e.g., E. Yablonovitch et al., "Regrowth of GaAs Quantum Wells on GaAs Liftoff Films 'Van der Waals Bonded' to Silicon Substrates", Electronics Letters, Vol. 25 (1989), p. 171; and E. Yablonovitch et al., "Double Heterostructure GaAs/AlGaAs Thin Film Diode Lasers on Glass Substrates", IEEE Photonics Technology Letters, Vol. 1 (1989), pp. 41–42.

Further with respect to epitaxial lift-off processing, as single-crystal layers typically are incorporated in devices or "chips" which are considerably smaller than a growth substrate or "wafer", and since lift-off of epitaxially grown layers is facilitated when the size of such layers does not exceed a practical limit, it is desirable to provide a means for partitioning a grown semiconductor layer prior to epitaxial lift-off. However, as an instance of a difficulty mentioned above, such partitioning is impeded in the presence of a support layer which is not amenable to patterning by selective irradiation. The invention described below is motivated by the desire for a patterning method which is applicable in this situation, and which does not rely on the use of radiation.

SUMMARY OF THE INVENTION

In epitaxial lift-off processing, patterning of a support layer on a structure comprising an epitaxially grown layer on a substrate is effected by heated mechanical means such as, e.g., a heated stylus or roller. Underlying material is partitioned by etching through grooves or channels formed by such patterning, and undercut etching is used to detach partitions from the substrate.

For the sake of ease of appreciation structural dimensions are not drawn to scale in the Figures.

DETAILED DESCRIPTION

In the Figures, like features are identified by the same numerals.

Figure 1:
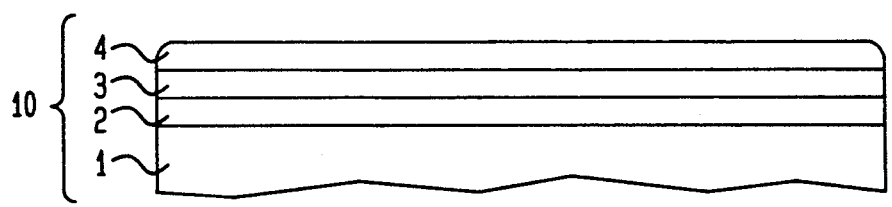
FIG. 1–4 are schematic elevations of a structure at sequential stages of processing in accordance with a preferred embodiment of the invention in epitaxial lift-off processing.

FIG. 1 shows an assembly 10 comprising growth substrate 1 (consisting, e.g., of doped or undoped gallium arsenide), epitaxial release layer 2 (consisting, e.g., of aluminum arsenide and having a thickness in a typical range from 2 to 1000 nanometers), epitaxial layer 3 (consisting, e.g., of doped or undoped aluminum gallium arsenide)—to be lifted off for removal to a different substrate, and support layer 4 (consisting, e.g., of "black wax" paraffinic-asphaltene, a wax-like material also known by the trade name Apiezon-W.) Layer 4 may have a thickness in a typical range from 10 to 1000 micrometers, and its formation may be by melting-on, or by painting or spraying in solution; in the case of Apiezon-W, trichloroethylene is suitable as a solvent. Also, formation of layer 4 may include heating (to a temperature of approximately 160 degrees C. in the case of Apiezon-W), followed by quenching, such processing being beneficial in the interest of increased stress at the interface between an epitaxial layer and its support layer. This, in turn, can result in advantageous edge-curling in a later removal step as described below in connection with FIG. 4. Support layer 4 may be provided with mechanical implants by which later removal is facilitated.

Suitability of a layer-4 material with respect to preferred processing of the invention is readily ascertainable by testing a layer by means of a heated stylus or roller, preferred temperature being chosen as a function of speed of motion, with higher temperatures corresponding to higher speeds and conversely. Preferred speeds also depend directly on stylus or roller pressure which, in the interest of minimizing mechanical damage to layer-3 material, may be controlled by spring loading at an essentially constant low level.

While, for the sake of clarity and ease of exposition, layer 3 is shown without structural features, it is understood that such layer may actually comprise a number of sub-layers which may be patterned and doped as, e.g., in the fabrication of microelectronic devices. This may involve inclusion of dielectric as well as of metallic layers which, typically, have amorphous or polycrystalline rather than epitaxial structure.

Figure 2:
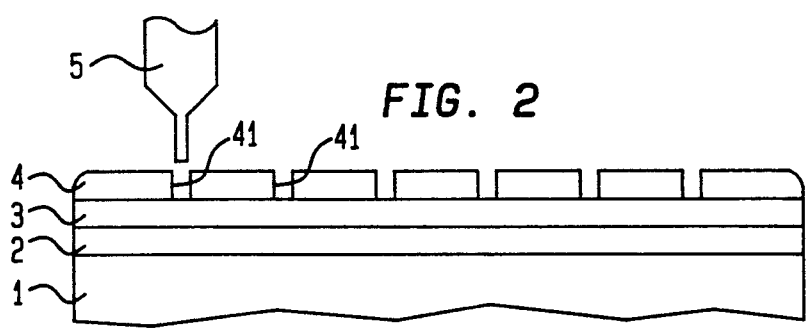

FIG. 2 further shows stylus 5, having been used on the structure of FIG. 1 to produce grooves or channels 41 in layer 4 by scoring; alternatively, grooves 41 can be produced by a roller. Such stylus or roller may be made, e.g., of stainless steel, preferably Teflon-coated, or of Teflon sandwiched between stainless steel support members. Typical width of the tip of a stylus or the edge of a roller is in the range from 5 to 100 micrometers, and, in the case of Apiezon-W, preferred stylus or roller temperatures are in a range from 100 to 200 degrees C., while essentially no pressure is applied. Typical stylus or roller speed is approximately 3 centimeters per second.

Figure 3:
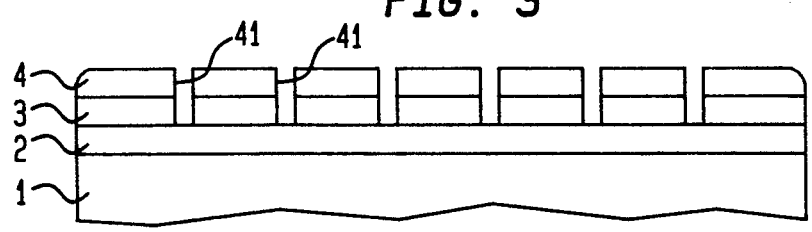

FIG. 3 shows the structure of FIG. 2 after (selective) etching of layer 3 via grooves 41, the patterned support layer 4 having served as a mask. In the case of gallium arsenide such etching may be carried out, e.g., by means of a mixture comprising 1 part sulfuric acid, 8 parts hydrogen peroxide, and 500 parts water by volume. Similarly suitable is a mixture of ammonium hydroxide and hydrogen peroxide.

Figure 4:
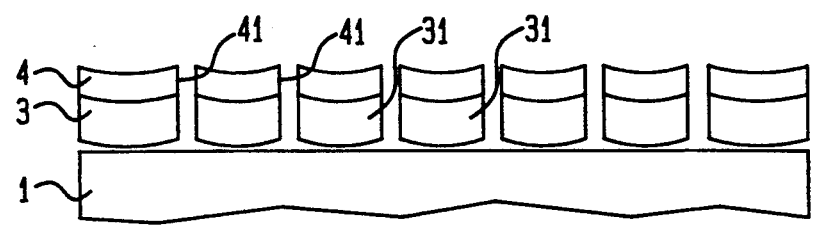

FIG. 4 shows the structure of FIG. 3 after undercut-etching of lift-off layer 2. In the case of aluminum arsenide such etching may be effected, e.g., by means of 10-percent hydrofluoric acid at a temperature near 0 degrees C. (This etchant was found to exhibit very high selectivity with respect to etching of aluminum arsenide while leaving certain aluminum gallium arsenide alloys essentially intact.) As mentioned above, in the presence of suitable strain in the structure to be lifted off (such strain being introduced by support layer 4), undercut-etching is facilitated by edge-curling, allowing reaction products such as hydrogen gas to escape, thereby permitting more complete penetration of the etchant between substrate 1 and layer 3. At this point, several supported films 31 can be picked up (mechanically or pneumatically, for example) or floated off for placement in an intended device environment. After such placement, layer-4 material may be removed by means of a chlorinated solvent.

Figure 5:
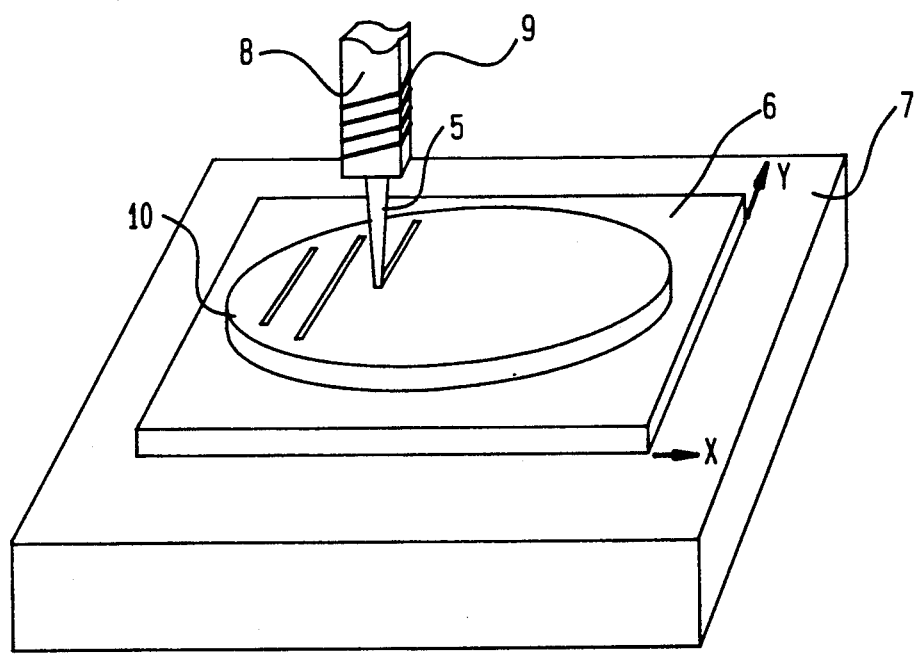
FIG. 5 is a schematic perspective view of exemplary patterning apparatus comprising a stylus in accordance with a preferred embodiment of the invention.

FIG. 5 illustrates apparatus by which preferred processing may be carried out, including substrate support 6 on x-y stage 7, stylus 5 attached to stylus support 8 which is equipped with electrical resistance heater 9.

Figure 6:
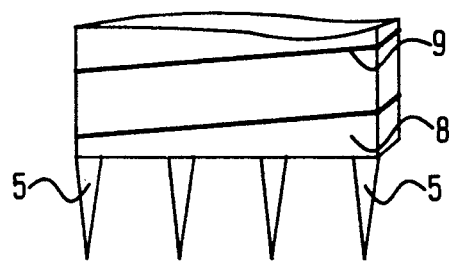
FIG. 6 is a schematic perspective view of an assembly comprising a plurality of styluses as may be preferred in accordance with an alternate embodiment.

FIG. 6 illustrates a detail variation of apparatus of FIG. 5, comprising a plurality of styluses in a rake-like structure.

Figure 7:
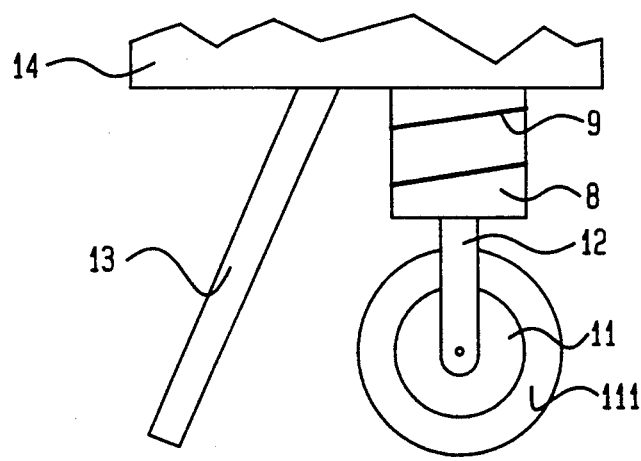
FIG. 7 is a schematic side view of an assembly comprising a heated roller and a wiper or scraper as may be used in accordance with a further preferred embodiment of the invention.
Figure 8:
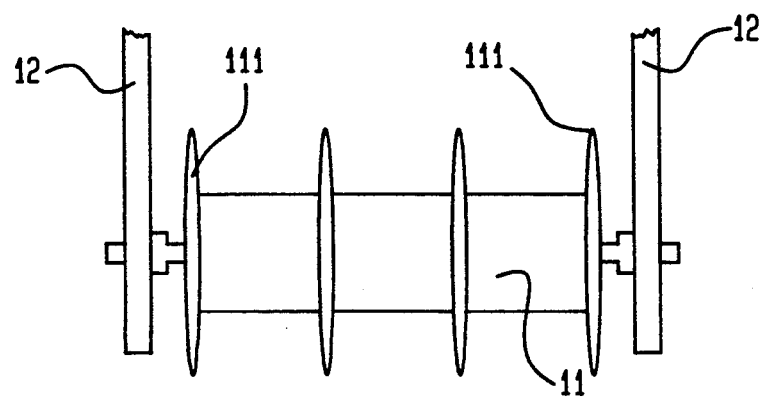
FIG. 8 is a schematic frontal view of an assembly comprising a roller provided with a plurality of rims as also may be preferred.

FIG. 7 shows a further variation of apparatus of FIG. 5, comprising roller 11 with rim 111, holder 12, support 8 with heater 9, (optional) wiper or scraper 13, and base 14 to which support 8 and wiper 13 are attached. Use of one or several rollers may be preferred over the use of styluses in the interest of precise corners in the case of intersecting grooves. A plurality of rollers may be used analogously to a plurality of styluses; also, as illustrated by FIG. 8, a roller 11 may be provided with a plurality of rims 111.

Grooves or channels may be formed by back and forth motion of a stylus or roller, or by motion of a stage on which the substrate is placed. Motion may be rectilinear or curvilinear, and may be controlled, e.g., by mechanical track following, or by computer commands. Commercially available stages, transits, or transports may be used.

Preferred processing in accordance with the invention is similarly applicable in epitaxial lift-off processing of structures grown on other types of substrates such as, e.g., an indium phosphide substrate (with an aluminum arsenide release layer, for example), or a silicon substrate (e.g., with a silicon dioxide release layer).

Exemplary processing in accordance with a preferred embodiment of the invention has been used to define and lift off epitaxial films having a size up to 2 by 4 centimeters. Such films may be included in solar cells, for example, and films of smaller dimensions may be included, e.g., in photodiodes, photodetectors, and other semiconductor devices.

We claim:

1. In the fabrication of microelectronic, optoelectronic, or photonic devices, a method for removing a structure from a substrate, said structure comprising an epitaxial semiconductor film grown on a release layer on said substrate, said method comprising the steps of
    forming on a surface of said structure a layer of a support material,
    patterning said layer of support material by heated mechanical means, thereby selectively exposing said surface,
    etching exposed surface material, and
    undercut-etching said release layer,
    whereby said support material supports said surface of said structure being released by undercut etching.

2. The method of claim 1, said support material comprising paraffinic-asphaltene wax.

3. The method of claim 1, said support material having a thickness in the range from 10 to 1000 micrometers.

4. The method of claim 1, said patterning producing a channel having a width in the range from 5 to 100 micrometers.

5. The method of claim 1, said heated mechanical means comprising a stylus.

6. The method of claim 5, said heated mechanical means comprising a plurality of styluses.

7. The method of claim 1, said heated mechanical means comprising a roller.

8. The method of claim 7, said heated mechanical means comprising a plurality of rollers.

9. The method of claim 7, said roller comprising a plurality of rims.

10. The method of claim 7, further comprising wiping of a channel formed by said heated mechanical means.

11. The method of claim 7, further comprising scraping of a channel formed by said heated mechanical means.

12. The method of claim 1, patterning resulting upon rectilinear relative motion between said substrate and said heated mechanical means.

13. The method of claim 1, patterning resulting upon curvilinear relative motion between said substrate and said heated mechanical means.

14. In epitaxial lift-off processing, a method for selectively freeing an epitaxial film from a substrate upon which it was grown on a release layer, comprising the steps of forming on said film a support layer, patterning said support layer by heated mechanical means to selectively expose said film under said support layer, and etching said exposed film through said patterned support layer until said film is removed from said substrate.

15. The method of claim 14 wherein said etching step includes undercut-etching of said release layer, whereby an edge of said film is curled by said support layer.

* * * * *